United States Patent [19]

Plissonnier

[11] Patent Number: 4,809,641
[45] Date of Patent: Mar. 7, 1989

[54] BASKETS FOR THE HANDLING OF SEMICONDUCTOR COMPONENTS

[75] Inventor: Bernard Plissonnier, Langres, France
[73] Assignee: Compagnie Plastic Omnium, France
[21] Appl. No.: 937,488
[22] Filed: Dec. 3, 1986

[30] Foreign Application Priority Data

Dec. 4, 1985 [FR] France .................... 85 17925

[51] Int. Cl.⁴ .............................................. B05C 13/02
[52] U.S. Cl. ..................... 118/500; 264/161; 264/328.9
[58] Field of Search ................ 118/500; 264/328.9, 264/161; 211/41

[56]  References Cited

U.S. PATENT DOCUMENTS 3,923,156 12/1975 Wallestad ................. 118/500 X
4,045,867  9/1977 Strom ..................... 264/157 X
4,113,826  9/1978 Jones .................... 264/328.9 X
4,520,934  6/1985 Aigo ......................... 211/41

FOREIGN PATENT DOCUMENTS 55-105545A  8/1980 Japan.

Primary Examiner—John McIntosh
Attorney, Agent, or Firm—Wegner & Bretschneider

[57]                ABSTRACT

The basket is first moulded such that at the extremities of the lower parts 16 of the side walls 12 are provided supplementary volumes 36 into which the injection points 24 of the plastic material open. After moulding, the supplementary volume 36 are removed by cutting along a plane P in order to obtain the final article of the required size. The invention eliminates from the final article the injection traces and zones which contain internal tensions which can in turn cause cracks.

6 Claims, 5 Drawing Sheets

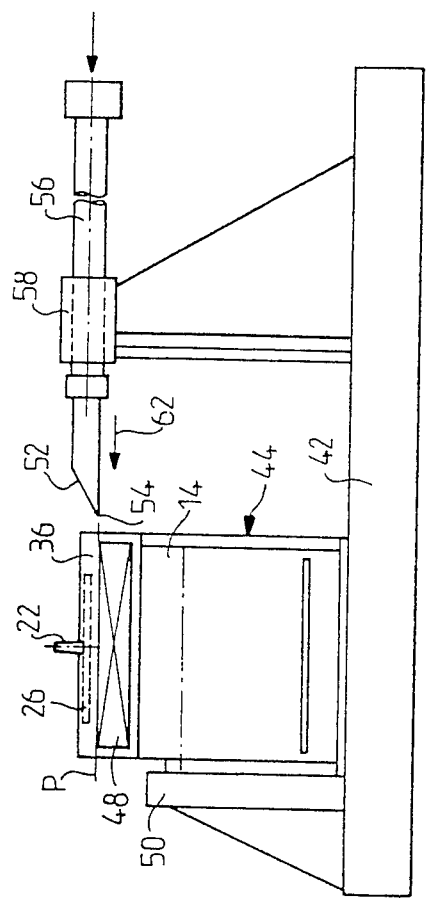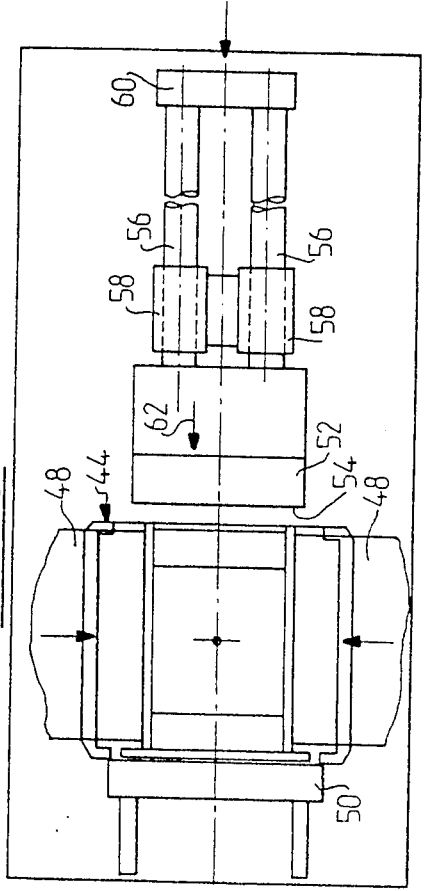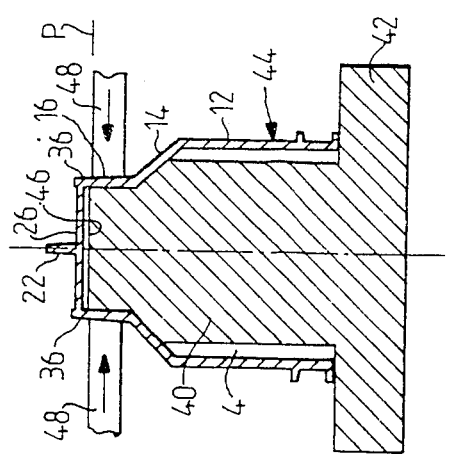

BASKETS FOR THE HANDLING OF SEMICONDUCTOR COMPONENTS

BACKGROUND OF THE INVENTION

The present invention concerns the baskets or supports used in the handling of silicon wafers in the semiconductor industry The wafers, which are very thin disks which can have a diameter of between 12 and 20 cm, are treated by immersion in a number of successive baths which are very corrosive and some of which are also very hot, for example of the order of 200° C.

In order to carry out this processing, the wafers are held in baskets, similar to drainage racks, which are transferred from one bath to another. These baskets are made from an inert injected plastic which is resistant to high temperatures, to the corrosive effect of the baths and which does not introduce impurities into the baths. Usually a plastic such as "Teflon-PFA" (a polytetrafluoroethylene resin) is used.

Very expensive components are formed from the silicon wafers, and this is why every precaution is taken to ensure maximum purity during the treatment.

In effect the presence of impurities in the baths can compromise the quality of the components fabricated, leading to a high waste load which can prove very costly. It is important therefore that the baskets themselves do not contribute to the pollution of succesive baths. For this reason the baskets are moulded in a controlled atmosphere in perfectly polished moulds, and their form is such as to allow the complete rinsing and drainage of the basket and the wafers supported therein.

Indeed, if traces of a previous bath are retained in surface flaws and thereby transferred to a subsequent bath, the latter can become contaminated and spoil the whole batch.

In spite of measures taken to avoid surface faults on the baskets, there remains the faults inherent to the injection process. These faults tend to be situated in zones where there are internal tensions, notably at the injection sills.

These tensions are due to:

turbulent flow of the material at the level of the injection sill, a temperature difference between the material inside the piece and the material in contact with the mould, an over injection necessary to compensate for the contraction that takes place during cooling, the fact that the feed troughs hinder the shrinkage of the piece or that shearing of the material takes place at the junction between the feed troughs and the piece.

These internal tensions are released in course of time through the effect of thermal shocks or through the corrosive action of the baths. This leads to the formation of cracks which increase in size with the basket's use and which retain particles from successive baths. After moulding of the basket, the injection cluster is cut, but the internal tensions situated around this point remain in the piece. Added to this, the cut cannot be made exactly in the plane of the piece, there being always a small part jutting out or else a small hollow. In both cases there is a fault which harbours particles, and consequently, acts as a source of contamination for the baths.

SUMMARY OF THE INVENTION

The aim of the present invention is to eliminate surface defects and cracks in injection moulded baskets.

The invention relates to a method for the manufacture of plastic injection moulded articles, notably baskets or supports for parts to be treated in successive baths, in the semiconductor industry. The method is characterized by the following steps: the machining of a mould which has at least one supplementary volume compared to the final article; the provision of entry points for the plastic material to be injected, in and only in the supplementary volume or volumes; the moulding of the piece; the withdrawing by cutting of the said supplementary volume or volumes, to obtain an article of the desired size free from injection zones which cause internal tensions which in turn create cracks capable of retaining impurities during usage of the article in successive baths.

Therefore if the supplementary volumes are cut cleanly, defects in the baskets in zones neighbouring the injection points are eliminated.

Of course this method involves a certain waste of material, but this loss is compensated by the improvement in quality of the finished product, a quality which is essential in the particular application of silicon wafers.

The invention relates also to a basket injection moulded using the above method and having: two lateral walls on the interior faces of which are slots for holding wafers; an upper part which is open, allowing the introduction and retrieval of these wafers; two end walls joining the lateral walls. The basket is characterized by the fact that the above mentioned supplementary volumes are two in number and are situated at the lower extremities of each lateral wall, and contain the points of injection of the plastic material.

The invention also relates to a mould for the fabrication of such a basket, the mould having one or more supplementary hollow parts into which the injection pipes lead and through which the material is injected into the mould.

The invention will be better understood from the reading of the following detailed description and attached drawings, which represent in a non-limiting way, several possible forms of the invention.

BRIEF DESCRIPTION OF THE DRAWINGS

FIGS. 8, 9 and 10 are cut away, side and top views of a machine for cutting away the supplementary volumes as the basket leaves the mould.

DETAILED DESCRIPTION OF THE DRAWINGS

Figure 1:
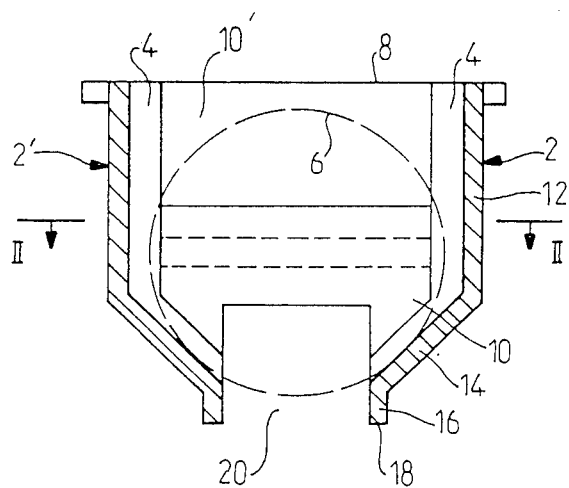
FIG. 1 is a schematic cross sectional view along the line I—I of FIG. 2 of a basket support for the handling of silicon wafers.
Figure 2:
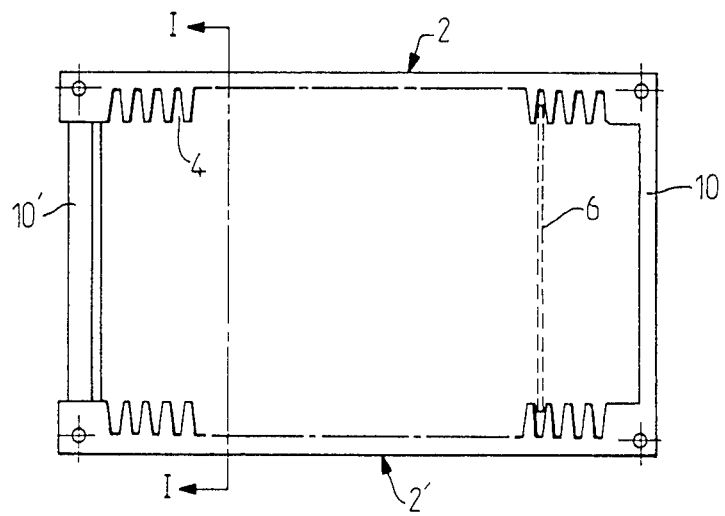
FIG. 2 is a schematic plane view of the same basket.

The state of the art basket represented by FIGS. 1 and 2 consists of: two lateral walls 2, 2' with slots 4 on their facing sides, for the holding of wafers 6; an open upper part 8 for the introduction and retrieval of wafers 6 into and from the basket; two end walls 10, 10' joining the lateral walls 2, 2'.

The lateral walls consist of: a main part 12; an intermediary part 14, generally oblique, which is turned towards the inside, and on which rest the wafers 6; a lower part 16 the outer edges 18 of which form the feet or surfaces on which the basket rests when posed. The bottom of the basket consists of an opening 20, situated between the lower parts 16, and which enables the penetration and evacuation of the liquid in the treatment baths.

Figure 3:
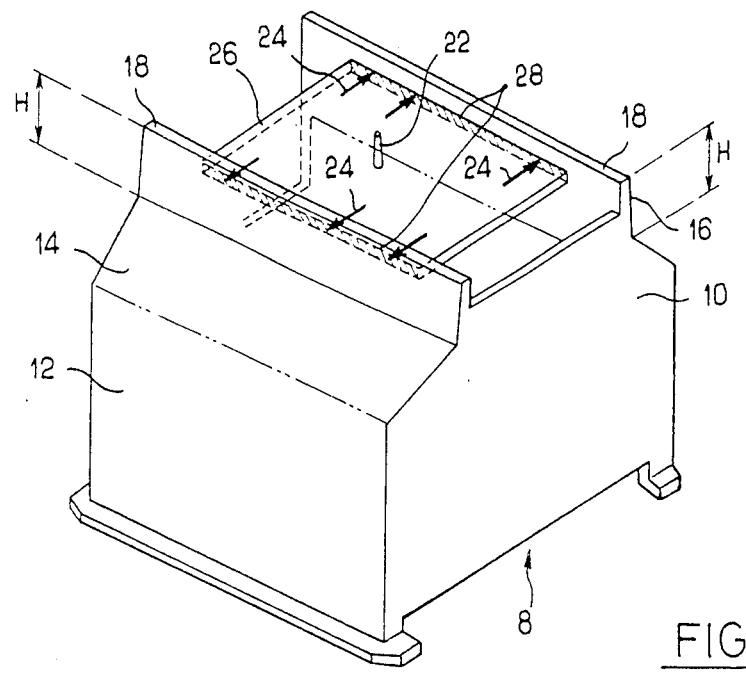
FIG. 3 is a perspective view of a basket turned upside down to illustrate the classical injection method.

FIG. 3 shows schematically the injection method employed until now in the moulding of such a basket. In the injection mould (not shown) having a form complementary to that of the basket to be moulded, there is a principal injection entry 22, and this is connected up with each subsidiary injection nozzle 24, which opens into the mould at the level of the lower parts 16 of the side walls. The area represented by the reference 26 is the zone where the injection cluster is formed, and the shaded areas 28 indicate the zones along which the injection sprues are cut away from the two inside faces of the lower parts 16 of the side walls.

Figure 4:
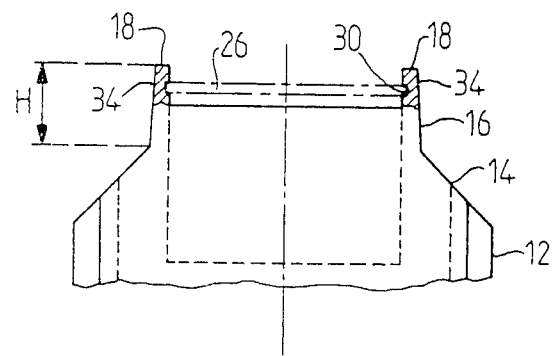
FIGS. 4 and 5 are partially cut away views illustrating the classical mode of separation of injection cluster and basket.
Figure 5:
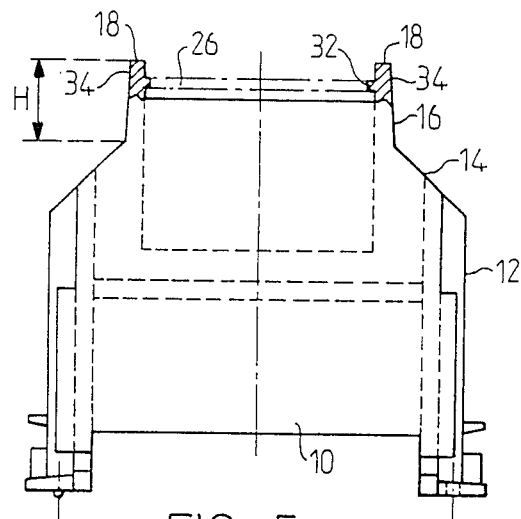

The areas in which the sectioning takes place, can form hollows 30 is represented in (FIG. 4) or projections 32 (FIG. 5) which, in both cases, constitute faults in or on which particles from the baths are harboured.

Moreover, the extremities 34 of the parts 16 of the side walls (FIG. 4 and FIG. 5), that is the parts of these walls which are at the level of, or at least are in the neighbourhood of the injection zone 26, contain the internal tensions which are, as has been shown above, the cause of cracks.

Figure 6:
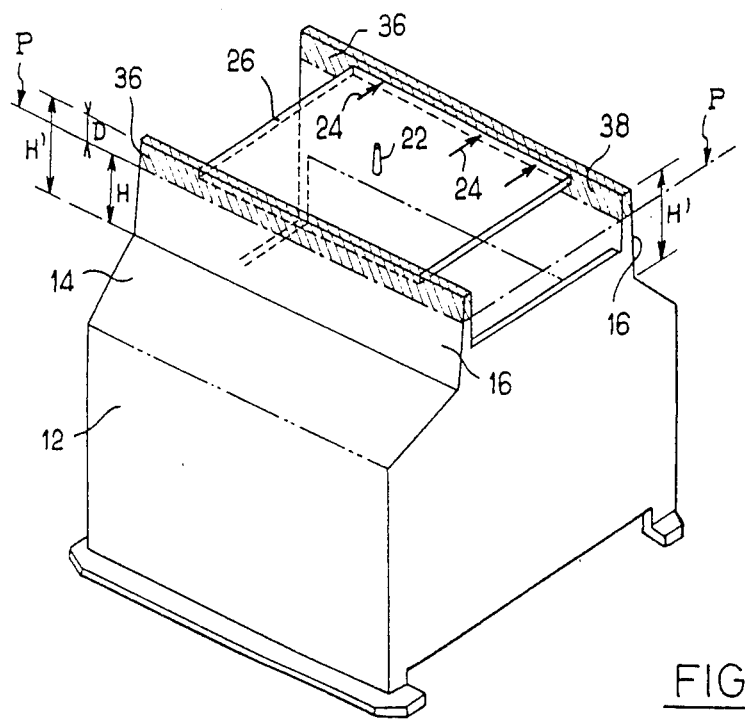
FIG. 6 is a view analogous to that of FIG. 3 but illustrating the mode of fabrication according to this invention.

FIG. 6 illustrates schematically a basket according to the present invention. The basket is first of all moulded in a mould, which provides, for the lower parts 16 of the lateral walls, a height H' bigger than the final height H of these lower parts (see FIGS. 3, 4 & 5). This greater height produces therefore, in the moulded piece 2, the supplementary volumes 36 which are represented by the shaded areas in FIG. 6.

The injection zone 26, with the injection nozzles 24 and the feed nozzle, is situated at the level of the supplementary volumes 36. The nozzles 24 open into the two opposite faces 38 of the supplementary volumes 36.

On withdrawal from the mould, the basket consists of a piece larger than the final object, that is to say it differs by an amount $D = H' - H$. The next step is to cut away the supplementary volumes 36, along the cutting plane P situated at the level H. This action reduces the basket to its final height.

Figure 7:
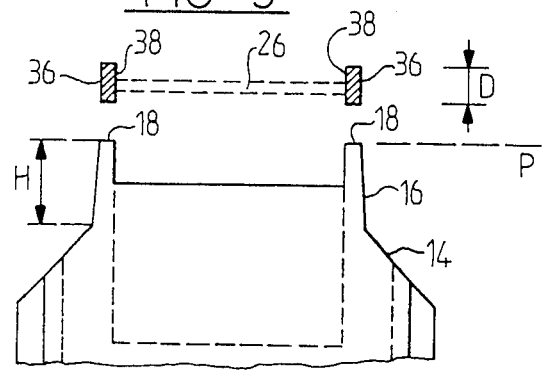
FIG. 7 is a view analogous to that of FIGS. 4 and 5 illustrating in part a basket according to the present invention with the supplementary volumes removed.

The cutting operation is illustrated in FIG. 7. The latter shows the two supplementary volumes 36, connected by the injection cluster 26, and separated from the rest of the basket along the cutting plane P.

As was shown above, the internal tensions which cause cracking, and the traces left on the cutting of the injection sprues, are all situated in the neighbourhood of the injection zone 26, that is, only in the supplementary volumes 36 which are to be eliminated. What is obtained therefore, is a final piece exempt from the defects inherent to the injection moulding technique. Such a piece does not present the contamination risks of existing baskets. It is to be noted that the amount of material lost (the supplementary volumes 36) is not very great, as can be seen in FIG. 7. In fact, the advantages presented by the improved basket far outweigh this minimal loss of material.

Of course, the cutting that takes place in the plane P must be precise and neat, giving the feet 18 of the basket (FIG. 7) a smooth surface, free from defects and as highly polished as the other surfaces of the basket.

The cut can be made by any appropriate means, but an apparatus such as is represented in FIGS. 8, 9, 10 is to be preferred.

The apparatus consists of a core 40 mounted on a body 42 and which receives and supports the basket 44 as it leaves the mould. At this stage the basket still comprises the supplementary volumes 36, the injection cluster 26 and the sprue of the injection feed entry 22. The upper face 46 of the core 40 coincides with the cutting plane P and the basket 44 is held against the core 40 at the level of the parts 12 of the side walls by a vice or pressure plates which exerts a pressure in the direction indicated by the arrows. The mechanism working the vice (not shown) is supported by the body 42.

The upper surface of the vice 48 is situated at the level of the cutting plane P.

The basket 44 is held firm against the core 40 by a back pressure plate 50, also supported by the body 42. The basket 44 is thus firmly held, without possibility of deformation taking place, with just the supplementary volumes 36 and the injection cluster emerging.

The apparatus also consists of a cutting blade 52 which is guided in such a way that it is displaced along the cutting plane P. The blade 52 can be carried by two rods 56 which slide along two slipways 58 supported by the body 42 in such a way that the edge 54 of the knife rests perpendicular to its direction of displacement. An actuator (not shown) acts on a coupling plate 60 connecting the two rods 56 and displaces the cutting assembly in the direction of the arrow 62.

All the parts of the apparatus, as well as the basket clamped between the core 40 and the pressure means 48, 50, form a perfectly rigid unit. The blade 52 is able to effect a neat cut along the plane P thus separating the supplementary volumes 36 and the injection cluster from the rest of the basket and at the same time ensuring that the edges or feet 18 of the basket are in as fine a polished state as the rest of its surface coming straight from the mould.

Figure 11:
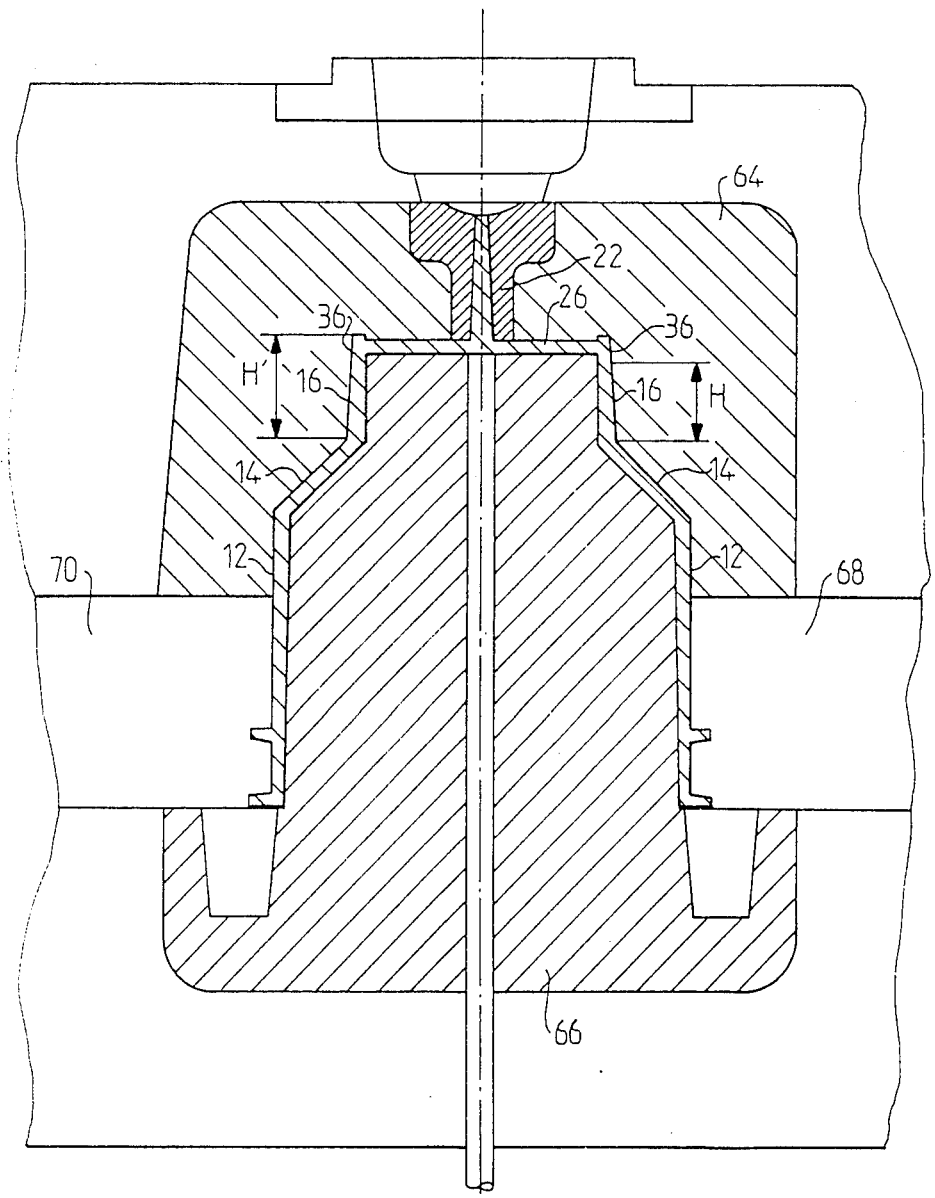
FIG. 11 is a cut away cross sectional view of a mould for the fabrication of baskets according to the present invention.

FIG. 11 represents a cut away view of a mould suitable for fabricating a basket according to the present invention. It is a standard injection mould in several parts 64-66-68-70, having a hollow impression corresponding to the article to be moulded and having two supplementary hollow volumes corresponding to the supplementary portions 36 of the parts 16 of the lateral walls of the basket.

As is seen in FIG. 11, the impressions of the mould corresponding to the injection cluster 26, which is fed by the nozzle 22, runs into the mould cavity at the level of the supplementary volumes 36.

In the above the supplementary volumes have been represented as prolongations of the lower parts 16 of the side walls, because it is generally at the lower extremity that the injection takes place. But it is of course possible that if the injection takes place at another part of the basket, for example at the upper end, or at one of the end walls, then the supplementary volume or volumes will be positioned accordingly.

What is claimed:

1. A basket moulded using an injected material, for the treatment of wafers in the semiconductor industry, which comprises two side walls of which the lower edges, situated in a plane P, form the feet on which the said basket can rest, wherein the said lower edges are formed by cutting, along a cutting plane common with plane P, two supplementary parallelepipedic moulded volumes defining an injection zone therebetween which prolong each of the said side walls along their entire length and width, the cutting being effected along the entire length of both said lower edges, by means of a cutting tool having a sharp edge, movable along cutting plane P outside of the injection zone.

2. The basket of claim 1, wherein the cutting being effected along the entire length of both said lower edges is performed simultaneously effecting a polished state along the cutting surface of said lower edges.

3. An injected plastic basket for the treatment of wafers in the semiconductor industry formed by a process comprising the steps of:
   (a) machining an injection mold having two supplementary parallelpipedic volumes with respect to the final basket being formed adjacent the entire length and width of lower edges of side walls along a cutting plane;
   (b) providing entry points for the plastic material being injection-molded, exclusively in the area of the supplementary volumes;
   (c) injecting plastic material into the mold; and
   (d) removing the supplementary volumes by cutting along said cutting plane to obtain a basket of desired size, free from injection zones liable to cause internal tensions, the cutting being effected by means of a cutting tool having a sharp edge, movable along said cutting plane outside of the injection zone.

4. An article according to claim 3, which is a basket or support for components to be treated in successive baths in the semiconductor industry.

5. A basket according to claim 4, for the handling of thin wafers in the semiconductor industry, which comprises two lateral walls on the interior faces of which are slots for holding wafers; an upper part with an opening allowing the introduction and retrieval of the wafers in and from the basket; two end walls joining the side walls; wherein:

the points of entry of the injected plastic material being situated on the two facing sides of the said supplementary volumes;

the side walls have their lower parts offset towards the inside; the supplementary volumes are situated at the extremities of the lower offset parts of the side walls.

6. The basket of claim 3, wherein the supplementary volumes are removed simultaneously by cutting along said cutting plane to effect a polished state along the cutting plane of the lower edges.

* * * * *